(12) United States Patent
Walsworth

(10) Patent No.: US 9,658,301 B2
(45) Date of Patent: May 23, 2017

(54) ABSORBTION-BASED DETECTION OF SPIN IMPURITIES IN SOLID-STATE SPIN SYSTEMS

(75) Inventor: Ronald Walsworth, Newton, MA (US)

(73) Assignee: President and Fellows of Harvard College, Cambridge, MA (US)

(*) Notice: Subject to any disclaimer, the term of this patent is extended or adjusted under 35 U.S.C. 154(b) by 759 days.

(21) Appl. No.: 14/125,072

(22) PCT Filed: Jun. 12, 2012

(86) PCT No.: PCT/US2012/042100
§ 371 (c)(1),
(2), (4) Date: Mar. 11, 2014

(87) PCT Pub. No.: WO2012/174019
PCT Pub. Date: Dec. 20, 2012

(65) Prior Publication Data
US 2014/0197831 A1    Jul. 17, 2014

Related U.S. Application Data

(60) Provisional application No. 61/496,538, filed on Jun. 13, 2011.

(51) Int. Cl.
*G01R 33/32* (2006.01)
*G01R 33/12* (2006.01)

(52) U.S. Cl.
CPC ....... *G01R 33/323* (2013.01); *G01R 33/1284* (2013.01)

(58) Field of Classification Search
CPC ................... G01R 33/323; G01R 33/1284
See application file for complete search history.

(56) References Cited

U.S. PATENT DOCUMENTS

2010/0271016 A1   10/2010 Barclay et al.
2010/0308813 A1   12/2010 Lukin et al.
(Continued)

FOREIGN PATENT DOCUMENTS

WO   2010010344 A1   1/2010
WO   2010010352 A1   1/2010
WO   2010149775 A1   12/2010

OTHER PUBLICATIONS

Fuchs G D et al., "Excited-state spin coherence of a single nitrogen-vacancy centre in diamond," Nature Physics, vol. 6, No. 9, Sep. 2010, pp. 668-672, Nature Publishing Group, UK.
(Continued)

*Primary Examiner* — Rodney Bonnette
(74) *Attorney, Agent, or Firm* — Elizabeth Kim Patent Law Offices LLC

(57) ABSTRACT

Absorption based detection of spin states of spin impurities within a solid-state spin system, such as NV centers in diamond, is implemented by measuring the absorption intensity of an optical signal applied to the spin impurities, i.e. change in intensity of the optical signal after the signal has been transmitted through the solid-state spin system. During optical excitation of the spin impurities, microwave pulses are applied to the sample at a frequency tuned to the ESR frequency. The relative populations of the spin states of the impurities, which provides information regarding variables of interest such as an external magnetic field or a quantum information protocol, is determined from the ratio of the absorption intensity of the optical signal when the microwave pulses are turned on, to the absorption intensity of the optical signal when the microwave pulses turned off.

3 Claims, 5 Drawing Sheets

(56) References Cited

U.S. PATENT DOCUMENTS

| | | | | |
|---|---|---|---|---|
| 2010/0315079 | A1* | 12/2010 | Lukin | G01R 33/032 324/244.1 |
| 2012/0051996 | A1* | 3/2012 | Scarsbrook | B82Y 10/00 423/446 |
| 2014/0247094 | A1* | 9/2014 | Englund | G01R 33/1284 331/94.1 |
| 2015/0048822 | A1* | 2/2015 | Walsworth | G01R 33/323 324/309 |
| 2015/0374250 | A1* | 12/2015 | Hatano | A61B 5/04008 600/409 |

OTHER PUBLICATIONS

Office Action for Japanese Patent Application No. 2014-515925, National Phase of PCT Application PCT/US2012/042100, JPO (Japanese Patent Office) Jan. 6, 2015.
Bukivsky P N et al., "IR-Spectroscopy of crystals containing Jahn-Teller impurity centers," Infrared Physics, vol. 29, No. 2-4 May 1, 1989, pp. 753-764, Pergamon, Great Britain.
Examination Report for European Patent Application No. 12728355.4 Regional Phase of PCT Application PCT/US2012/042100, EPO (European Patent Office), Jan. 22, 2015.
Jelezko F. et al, "Single spin states in a defect center resolved by optical spectroscopy", Applied Physics Letters, vol. 81, No. 12, AIP, American Institute of Physics, Melville, NY, US, Sep. 16, 2002.
"International Search Report" for PCT/US2012/042100, 3 pages, European Patent Office, Rijswijk, The Netherlands, Dec. 5, 2012.

* cited by examiner

ABSORBTION-BASED DETECTION OF SPIN IMPURITIES IN SOLID-STATE SPIN SYSTEMS

CROSS-REFERENCE TO RELATED APPLICATIONS

This application is a 35 U.S.C. §371 National Phase Entry Application of International Application no. PCT/US12/42100 filed Jun. 12, 2012, which designates the U.S., and which claims the benefit of priority under 35 U.S.C §119(e) of U.S. Provisional Patent Application No. 61/496,538 (the "'538 provisional application"), filed Jun. 13, 2011 and entitled "Absorption Based Detection of Nitrogen-Vacancy Ensembles in Diamond." The contents of each of these applications are incorporated herein by reference in their entireties.

STATEMENT REGARDING FEDERALLY SPONSORED RESEARCH

This invention was made with government support under contract number 60NANB10D002 awarded by NIST (National Institute Of Standards And Technology). The government has certain rights in the invention.

BACKGROUND

Spin impurities in solid state spin systems, such as nitrogen-vacancy (NV) centers in diamond, have attracted considerable interest because their electronic spin degrees of freedom can be coherently controlled by microwave radiation, and the spin states of the system can be polarized and readout by optical fields. Long coherence times also make them appealing.

Spin impurities such as NV centers thus have wide applications, ranging from magnetometry, quantum computers and bioimaging to super-resolution microscopy. Obtaining good quality of signals for these applications, for example, increasing magnetic sensitivity for magnetometry, requires long spin coherence times and high photon collection efficiencies.

The traditional method for reading out the electronic spin state of the NV centers is fluorescence-based detection. However, only a small fraction of the fluorescence falls within the solid angle collected by the objective, so that the collected photons at the detector, in general, is less than 1%.

Accordingly, there is a need for more sensitive methods and systems for detecting electronic spin states of spin impurities such as NV centers in diamond.

BRIEF DESCRIPTION OF THE DRAWINGS

The drawings disclose illustrative embodiments. They do not set forth all embodiments. Other embodiments may be used in addition or instead.

DESCRIPTION

Illustrative embodiments are discussed in this disclosure. Other embodiments may be used in addition or instead.

Before the present invention is described in further detail, it should be understood that the invention is not limited to the particular embodiments described, as such may vary. It should also be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

In the present disclosure, methods and systems are described for reading out electronic spin states of spin impurities such as NV centers in diamond, by measuring the change in optical transmission through the bulk diamond sample due to optical absorption by NV centers.

Figure 1:
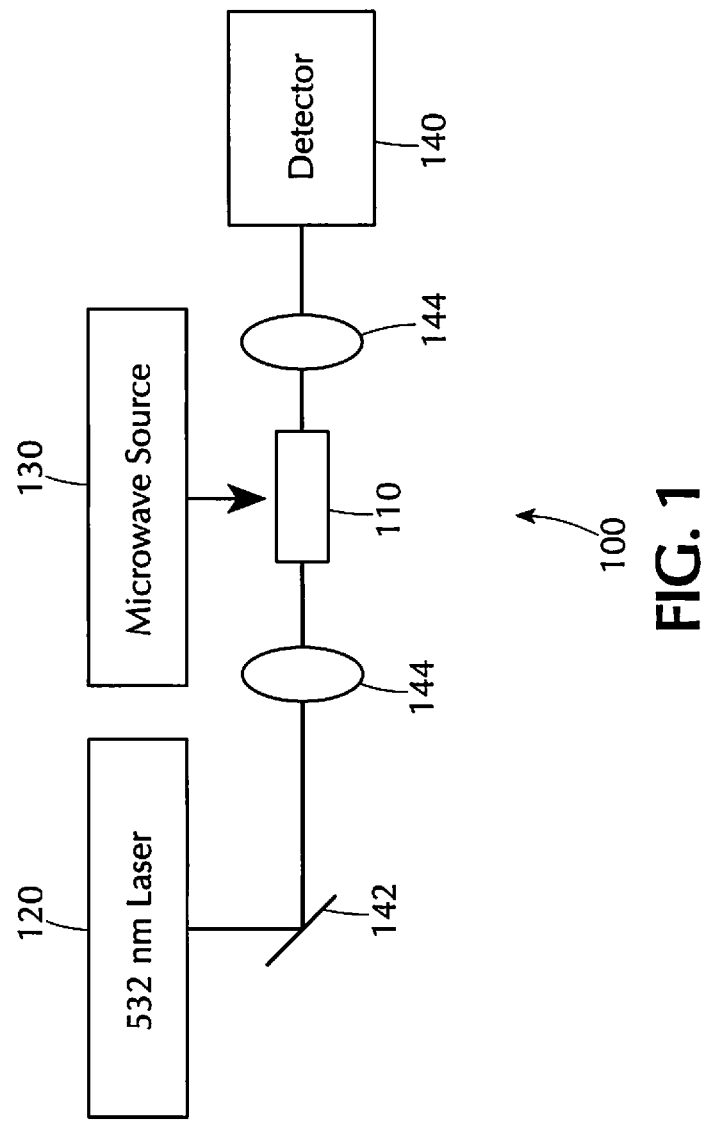
FIG. 1 is a schematic block diagram of a system for absorption based detection of spin impurities in a solid-state spin system, in accordance with one embodiment of the present application.

FIG. 1 is a schematic block diagram of a system 100 for absorption based detection of spin impurities in a solid-state spin system, in accordance with one embodiment of the present application. In overview, the system 100 includes a bulk sample 110, containing spin impurities within a solid state lattice; an optical source 120; a microwave source 130; and a detector 140 configured to detect output radiation from the spin impurities after light (from the optical source 120) and microwave fields (from the microwave source 130) have been applied to the spin impurities in the sample 110, and have been transmitted through the sample.

In the illustrated embodiment, the bulk sample 110 is a diamond crystal, and the spin impurities are NV centers in the diamond crystal lattice. As further described in conjunction with FIGS. 2A and 2B below, NV centers are crystallographic defects in the structure of the diamond, i.e. defects in the lattice structure of a crystal of diamond. In one embodiment, the bulk sample may have a size of about 4×2×1 mm and an optical depth of about 1.0±0.1 in the longest dimension. It is expected that not all light is absorbed by NV-centers and the true optical thickness is smaller than 1.0±0.1.

The optical source 120 is configured to generate light. When the light is applied to the spin impurities, some of the light is absorbed by the spin impurities. The absorption intensity can be measured as a change in intensity of the light from the optical source 120 after being transmitted through the spin impurities. In the illustrated embodiment, the optical source 120 is a laser that generates excitation light having a wavelength of about 532 nm (nanometers). Optical illumination of the spin impurities causes optical transitions between the electronic spin states of the spin impurities, which affect the relative populations of the different spin states, as further described below.

Optical elements such as a mirror 142 and lenses 144 may be included. These elements may be used, among other things, to increase or vary the optical depth of the sample 110.

The RF source 130 is configured to generate pulses of RF radiation that can be applied to the electronic spin impurities. In the illustrated embodiment, the RF source 130 is a microwave source that generates microwaves. Microwaves tuned at the resonance frequency of the spin impurities are applied to the spin impurities, during optical excitation of the spin impurities by laser light from the laser 120. The ratio of absorption intensities between microwave on and off have a known relationship to the rate of change of the relative populations of the different spin states of the spin impurities, as further described below, allowing the relative populations to be determined based on measurements of the absorption intensities with the microwaves on and off.

The detector 140 detects output optical radiation from the spin impurities after light from the laser 120 and the microwaves from the RF source 130 have passed therethrough. In the illustrated embodiment, the detector 140 is a photodiode. Many other types of detectors may be used, include without limitation to CCD (charge coupled device) arrays, optical fibers, plasmonic waveguides, and devices that make use of super-resolution optical techniques (e.g. STED).

During measurements, the intensity of the laser beam from the laser 120 and the microwave intensity from the microwave source 130 are varied. Knowing the incident laser power and beam diameter, the laser intensity can be converted into optical transition rate using the saturation intensity, which can be calculated from the cross section and the spontaneous decay rate. The Rabi frequency can be obtained from the microwave power and geometrical shape of the microwave strip line. It can also be directly measured from pulsed microwave experiments; however, these conversion relation have a factor of 2 experimental uncertainty.

A processing system may be integrated with the detector 140, and is configured to perform the above-mentioned computations, as well as other computations described in more detail below. The processing system is configured to implement the methods, systems, and algorithms described in the present application. The processing system may include, or may consist of, any type of microprocessor, nanoprocessor, microchip, or nanochip. The processing system may be selectively configured and/or activated by a computer program stored therein. It may include a computer-usable medium in which such a computer program may be stored, to implement the methods and systems described above. The computer-usable medium may have stored therein computer-usable instructions for the processing system. The methods and systems in the present application have not been described with reference to any particular programming language; thus it will be appreciated that a variety of platforms and programming languages may be used to implement the teachings of the present application.

Figure 2A:
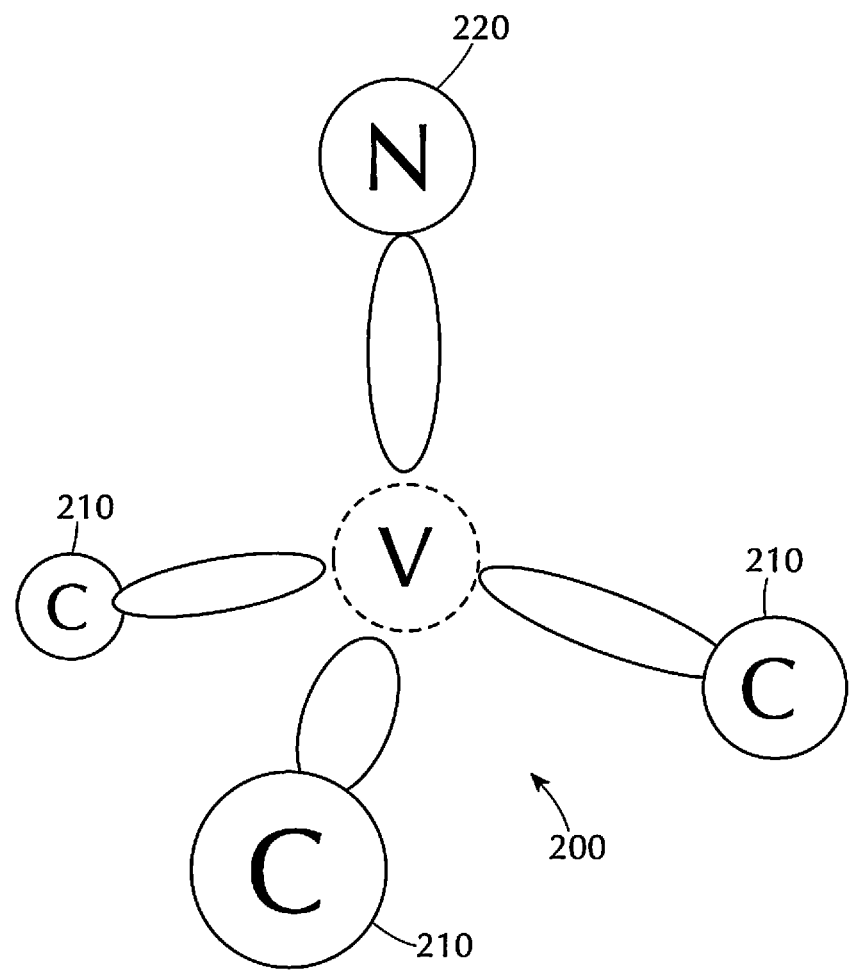
FIG. 2A schematically illustrates the crystal structure of an NV center in diamond.

FIG. 2A schematically illustrates the crystal structure of an NV center 200 in diamond. As seen in FIG. 2A, the NV center is an empty position or vacancy resulting from a missing carbon atom in the diamond lattice. The NV impurity is based in the lattice of carbon atoms 210, where two adjacent sites are altered, because one carbon atom is replaced with a nitrogen atom 220 and the other space is left vacant. The vacancies may interact with interstitial atoms such as nitrogen 220, and may act as color centers by absorbing visible light. NV centers are visible as red spots when illuminated by laser.

An NV center is relatively insulated from magnetic interference from other spins. The quantum state of the spin of the NV center may be probed controlled at room temperature. NV centers in diamond, as well as systems involving other types of defects in regular solid state lattices, can provide electronic spins that have very little interaction with the background lattice. Such electronic spins are optically detectable with unique optical signatures.

Figure 2B:
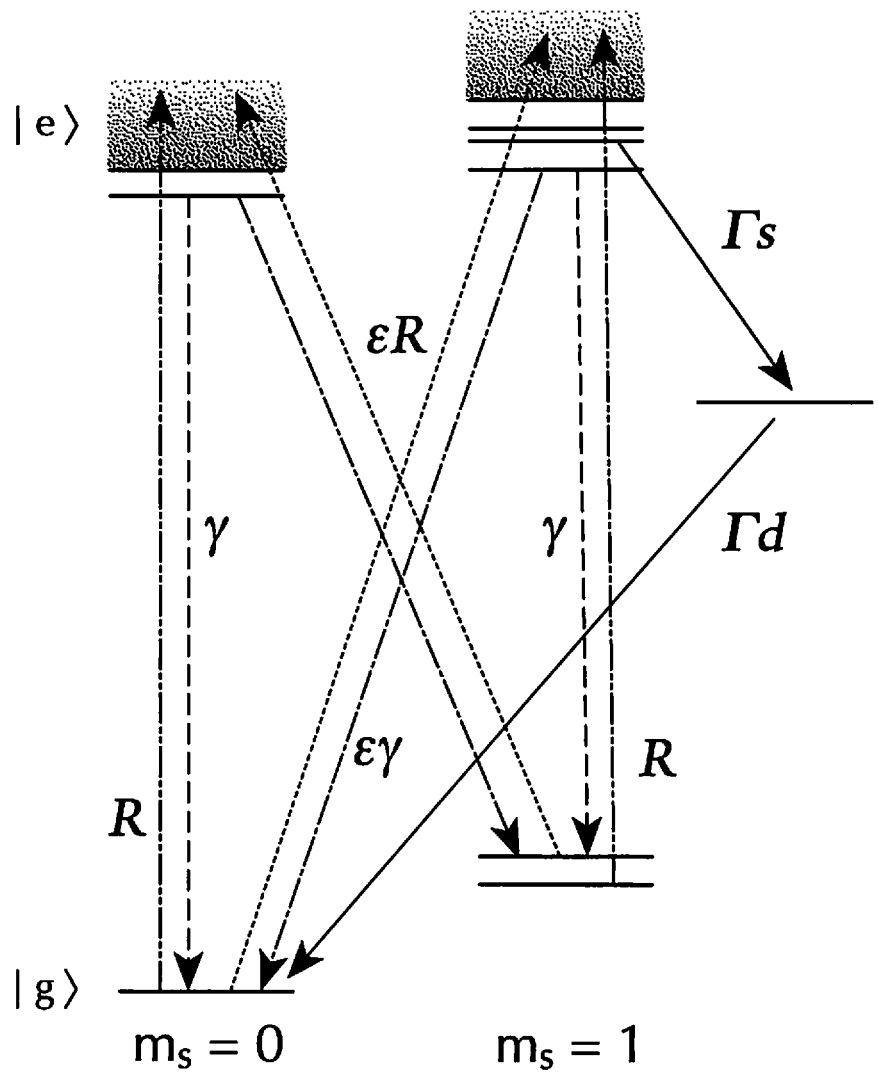
FIG. 2B shows the electronic structure of the NV center shown in FIG. 2A.

FIG. 2B shows the electronic structure of an NV center in diamond. As shown in FIG. 2B, the fine structure of the electronic ground state of an NV center is an $m_s=\pm 1$ spin triplet, with a $\Delta=2.87$ GHz crystal field splitting. The zero phonon line (ZPL) emission between excited and ground states is at 637 nm. In FIG. 2B, R represents the optical transition rate, $\gamma$ represents the spontaneous decay rate of spin conserving transition, $\epsilon$ represents the small fraction of spin non conserving transition. $\Gamma_s$ represents the shelving rate from the $m_s=\pm 1$ excited states (described below), and $\Gamma_d$ represents the shelving rate from the metastable singlet state (described below).

ESR (electron spin resonance) experiments have shown that the ground state of the NV center is a spin triplet. In the absence of an external field, the spin-spin interactions between the two unpaired electrons at the NV center further split the triplet into $m_s=0$ state with A1 symmetry and $m_s=\pm 1$ states with E symmetry, which are separated by 2.87 GHz. An external field causes a Zeeman shift between $m_s=+1$ and $m_s=-1$ states, which is determined by a gyromagnetic ratio $\gamma=2.8$ MHz/G. Regarding the electronic structure of excited states, it is known that there are six excited states, corresponding to two $m_s=0$ levels with E symmetry and four $m_s=\pm 1$ levels with A1, A2, and E symmetry. In addition, there is a metastable spin singlet A1 state.

It has been demonstrated that optical illumination causes the ground $m_s=0$ state to become dominantly populated. The other parameters can be assumed to be populated on the time scale of ~μs. Transitions into the metastable state occur primarily from the excited $m_s=\pm 1$ states, which decay primarily to the ground $m_s=0$ state. Since the electric dipole transitions are, to leading order, spin conserving, the $m_s=0$ ground state will eventually be occupied and the $m_s=\pm 1$ ground states will be depleted.

In the present application, the following labels are use for the above-described five spin states of the NV centers: two ground states, namely $|1\rangle$ (for $m_s=0$), and $|2\rangle$ (for $m_s=\pm 1$); two excited states, namely $|3\rangle$ (for $m_s=0$) and $|4\rangle$ (for $m_s=\pm 1$), and one metastable singlet state, $|5\rangle$.

To completely describe the time evolution of the NV center electronic states as a function of optical transition rate and Rabi frequency, a five-level rate equation model is introduced and 2×2 Bloch equations used, in one embodiment of the present disclosure. The main interest is in the population of each state because the coherences, except for the ground states coherence, decay faster than the other time scales.

In this embodiment, the rate equations for the five-level model are given by:

$$\frac{d\rho_i}{dt} = A_{ij}\rho_j,$$

where $\rho_i$ is the population in the $i^{th}$ state and $A_{ij}$ is the transition rate from the $j^{th}$ state to the $i^{th}$ state.

The transition matrix A is given by the following expression:

$$A = \begin{pmatrix} -R(1+\epsilon) & 0 & \gamma & \epsilon\gamma & \Gamma_d \\ 0 & -R(1+\epsilon) & \epsilon\gamma & \gamma & 0 \\ R & \epsilon R & -\gamma(1+\epsilon) & 0 & 0 \\ \epsilon R & R & 0 & -\gamma(1+\epsilon)-\Gamma_s & 0 \\ 0 & 0 & 0 & \Gamma_s & -\Gamma_d \end{pmatrix}$$

where R is the optical transition rate, $\gamma=77$ is the spontaneous decay rate of spin conserving transition, $\epsilon=1.5/77$ is the small fraction of spin non conserving transition, $\Gamma_s=30$ is the shelving rate from $|4\rangle$, and $\Gamma_d=3.3$ is the shelving rate from $|5\rangle$. The numbers are in units of $10^6$ s$^{-1}$. The other parameters are assumed to be negligibly small.

To model the coherent mixing between the ground states, $|1\rangle$ and $|2\rangle$, the coherent states need also be included in the rate equations. The Bloch equations for a two-level system is given by:

$$\frac{d\rho_{11}}{dt} = +\gamma_g \rho_{22} + \frac{i}{2}(\Omega^*\tilde{\rho}_{21} - \Omega\tilde{\rho}_{12})$$

$$\frac{d\rho_{22}}{dt} = -\gamma_g \rho_{22} + \frac{i}{2}(\Omega^*\tilde{\rho}_{12} - \Omega\tilde{\rho}_{21})$$

$$\frac{d\tilde{\rho}_{12}}{dt} = -\left(\frac{\gamma_g}{2} + i\delta\right)\tilde{\rho}_{12} + \frac{i}{2}\Omega^*(\rho_{22} - \rho_{11})$$

$$\frac{d\tilde{\rho}_{21}}{dt} = -\left(\frac{\gamma_g}{2} + i\delta\right)\tilde{\rho}_{12} + \frac{i}{2}\Omega^*(\rho_{11} - \rho_{22})$$

where $\Omega$ is the Rabi frequency, $\delta$ is the microwave detuning from 2.87 GHz, and $\gamma_g$ is the spontaneous decay of $|2\rangle$ state to $|1\rangle$ state. In these calculations, resonant microwaves ($\delta=0$) are applied, and the spontaneous decay is ignored ($\gamma_s=0$).

Figure 3A:
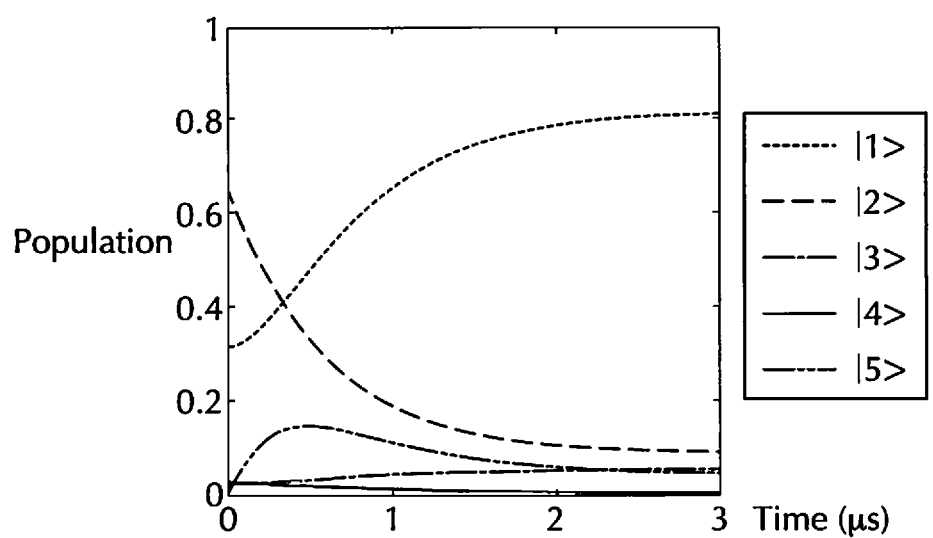
FIGS. 3A and 3B illustrate the time evolution of each electronic state of the NV center shown in FIG. 2B.
Figure 3B:
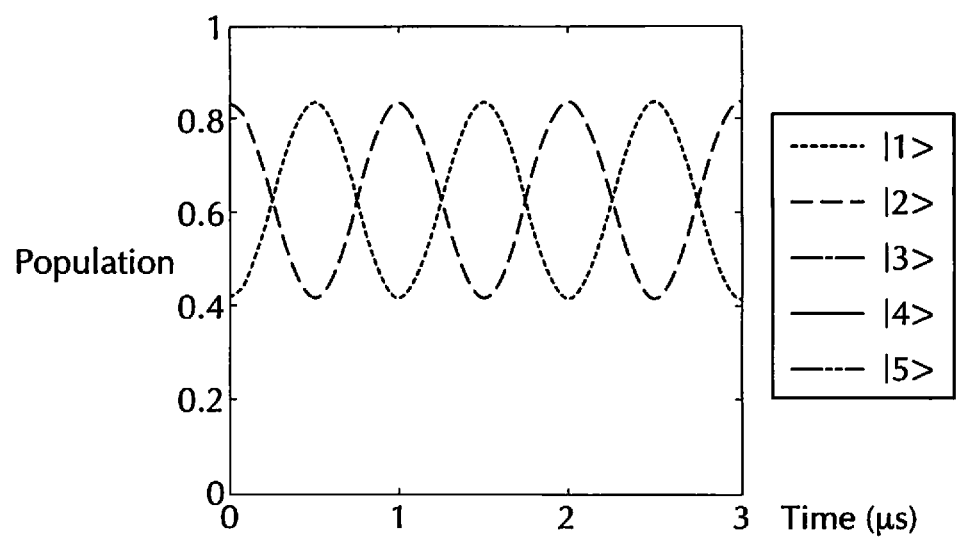

FIGS. 3A and 3B illustrate two examples of the time evolution of each state population calculated by the model described above, under continuous optical excitation or microwave radiation. The initial condition is chosen to be thermal equilibrium, so that the total population is evenly distributed among the three ground states.

FIG. 3A, which is a plot for R=5 MHz, $\Omega$=0 MHz, presents electron spin polarization, i.e. describes the polarization into $|1\rangle$ state. The system reaches equilibrium around 3 μs, where more than 80% of the electrons is populated in $|1\rangle$.

FIG. 3B, which illustrates the R=0 MHz, $\Omega$=1 MHz case, shows periodic coherent mixing between $|1\rangle$ and $|2\rangle$. In other words, FIG. 3B shows simple Rabi oscillations between $|1\rangle$ and $|2\rangle$, as expected.

Electron spin resonance (ESR) measurements determine the change in the signals as microwaves fields resonant with the electronic spin transitions are applied. The spin state populations are related to absorption ESR signal contrast. When the microwave frequency is varied, the resonance peak appears around 2.87 GHz. The peak frequency will be Zeeman shifted if a static field is applied. ESR measurements thus tell what the energy split is between $|1\rangle$ and $|2\rangle$.

The signal contrast for the above-described absorption scheme substantially increases, with increasing R, as seen when one sweeps the optical transition rate R and the Rabi frequency $\Omega$. The absorption contrast is defined by the following expression:

$$C_A = (I_T^{on} - I_T^{off})/I_T^{off},$$

where $I_T^{on/off}$ is the transmitted laser intensity with microwave on/off.

The absorption contrast can be rewritten in terms of the optical depth D and the absorption laser intensity with microwave on/off, showing the increase in absorption contrast that can be obtained by increasing the optical depth D:

$$C_A = (e^D - 1)(I_A^{off} - I_A^{on})/I_A^{off}.$$

The population of spin states is related to the ratio of absorption intensities through the following equation, obtained in a model in which the equilibrium population is evaluated under continuous excitation:

$$\frac{A^{on}}{A^{off}} = \frac{\rho_{11}^{on} + \rho_{22}^{on}}{\rho_{11}^{off} + \rho_{22}^{off}}\bigg|_{equilibrium}.$$

Numerical simulation results have shown that, as R (the optical transition rate) increases, much of the population becomes trapped in the metastable state, and the absorption rate decreases; however, for large R>10 MHz and $\Omega$>2 MHz, the absorption contrast becomes larger than fluorescence contrast.

Figure 4:
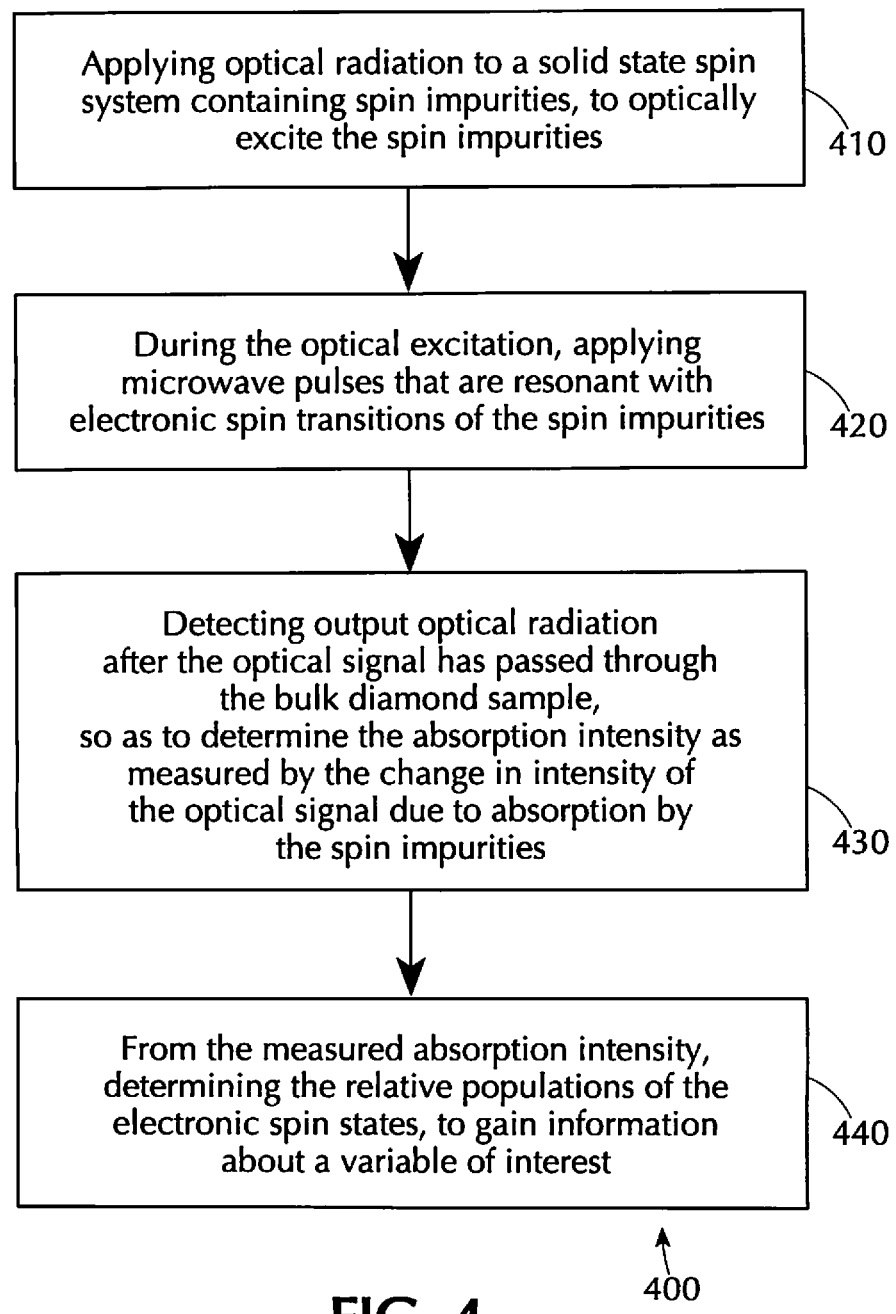
FIG. 4 is a schematic flow chart of a method for absorption-based detection of spin impurities in a solid-state spin system, in accordance with one embodiment of the present application.

FIG. 4 is a schematic flow chart of a method 400 for absorption-based detection of spin impurities in a solid-state spin system, in accordance with one embodiment of the present application. In overview, the method is based on measuring the absorption intensity of an optical signal applied to spin impurities in a solid state system, by measuring a change in intensity of the optical signal after the signal has been transmitted through the solid-state spin system.

The method 400 includes an act 410 of applying optical radiation to a solid state spin system containing spin impurities, to optically excite the spin impurities. The method 400 further includes an act 420 of applying, during the optical excitation, microwave pulses that are resonant with electronic spin transitions of the spin impurities. The method 400 further includes an act 430 of detecting output optical radiation after the optical signal has passed through the bulk diamond sample, so as to determine the absorption intensity as measured the change in intensity of the optical signal due to absorption by the spin impurities.

The method 400 further includes an act 440 of determining, from the measured absorption intensity, the relative populations of the electronic spin states, to gain information about a variable of interest.

In summary, methods and systems have been described for absorption based NV ensemble state detection. In particular, one exemplary embodiment of NV ensemble state detection via absorption of 532 nm excitation light has been described in detail. This approach has been shown to provide unity detection efficiency of absorbed photons, which is much larger than traditional fluorescence-based state detection.

Absorption based detection works particularly well with samples containing high densities of NV centers, since with such samples a significant reduction in the transmission of the green excitation light will be seen. While initial measurements on a sample with an optical depth of about 1.0 show low signal contrast in the small optical and microwave excitation rate regime, numerical simulations indicate that absorption contrast can exceed fluorescence contrast with a larger optical depth sample and higher optical and microwave excitation rates.

A number of methods may be used in order to improve the absorption signal contrast. One method is to increase the optical depth, since the absorption ESR contrast is proportional to $e^D-1$, where D is the optical depth of the sample. D may be increased either by providing a longer sample or by a multiple path scheme using mirrors and lenses. Another method is to use higher laser and microwave power. Numerical simulations have been performed that predict the absorption ESR contrast to become larger than the fluorescence contrast above 10 MHz of optical transition rate and 2 MHz of Rabi frequency for a sample with optical depth D=1.0. Finally, another method for improving absorption signal contrast is to apply a homogeneous static magnetic field for pulsed measurements. By applying a homogeneous static magnetic field, one can focus on one class of NV centers and measure the contrast more precisely. Also, the resonance frequency can be obtained more accurately, which is necessary in order to obtain the Rabi nutation signal.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

While certain embodiments have been described, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A system comprising:
    an optical source configured to generate light that can optically excite electronic spin states of electronic spin impurities in a solid state lattice, when applied to a sample containing the spin impurities and the solid state lattice;
    a microwave source configured to generate microwave pulses that can be applied to the sample during optical excitation by the light, at a frequency tuned to the electronic spin resonant frequency of the spin impurities;
    a detector configured to detect output optical radiation after the optical signal has passed through the sample, so that the absorption intensity of the optical radiation can be measured; and
    a processing system configured to calculate relative populations ($\rho$) of the electronic spin states from the measured absorption intensity (A) and use the relative populations to obtain information about a variable of interest,
    wherein the processing system is further configured to calculate the relative populations of the electronic spin states of electronic spin impurities using a mathematical model that relates the relative populations of the electronic spin states to a ratio of the absorption intensity of the optical signal when the microwave pulses are turned on ($A^{on}$) to the absorption intensity of the optical signal when the microwave pulses are turned off ($A^{off}$), by a formula given by:

$$\frac{A^{on}}{A^{off}} = \frac{\rho_{11}^{on} + \rho_{22}^{on}}{\rho_{11}^{off} + \rho_{22}^{off}}\bigg|_{equilibrium}.$$

2. The system of claim 1, wherein the sample comprises bulk diamond and wherein the electronic spin impurities comprise NV centers in the diamond.

3. The system of claim 1, wherein the optical source is a laser that is tunable to a frequency of 532 nm.

* * * * *